(12) United States Patent
Willeke et al.

(10) Patent No.: US 9,773,744 B2
(45) Date of Patent: Sep. 26, 2017

(54) SOLDER BUMP CLEANING BEFORE REFLOW

(75) Inventors: Reiner Willeke, Dresden (DE); Sören Zenner, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1440 days.

(21) Appl. No.: 13/181,111

(22) Filed: Jul. 12, 2011

(65) Prior Publication Data

US 2013/0017681 A1 Jan. 17, 2013

(51) Int. Cl.
*H01L 21/20* (2006.01)
*H01L 23/00* (2006.01)
(Continued)

(52) U.S. Cl.
CPC ............ *H01L 24/11* (2013.01); *B23K 1/008* (2013.01); *B23K 1/0016* (2013.01); *B23K 1/206* (2013.01); *H01L 24/13* (2013.01); *B23K 2201/42* (2013.01); *H01L 2224/0345* (2013.01); *H01L 2224/0361* (2013.01); *H01L 2224/03452* (2013.01); *H01L 2224/03614* (2013.01); *H01L 2224/03912* (2013.01); *H01L 2224/0401* (2013.01); *H01L 2224/05027* (2013.01); *H01L 2224/05155* (2013.01); *H01L 2224/05166* (2013.01); *H01L 2224/05171* (2013.01); *H01L 2224/05572* (2013.01); *H01L 2224/05647* (2013.01); *H01L 2224/05655* (2013.01);
(Continued)

(58) Field of Classification Search
CPC ............................................. H05K 2201/0367
See application file for complete search history.

(56) References Cited

U.S. PATENT DOCUMENTS 5,238,500 A * 8/1993 Bergman .......... H01L 21/67075
134/1.3
5,404,265 A * 4/1995 Moresco et al. ........... 361/306.1
(Continued)

FOREIGN PATENT DOCUMENTS

CN 101026106 8/2007
CN 101197296 6/2008
(Continued)

OTHER PUBLICATIONS

Helneder et al., "Evaluation of lead-free SnAg solder ball deposition and reflow process for flip chip applications," Microelectronic Engineering, 82:581-86, 2005.
(Continued)

*Primary Examiner* — Zandra Smith
*Assistant Examiner* — Andre' C Stevenson
(74) *Attorney, Agent, or Firm* — Amerson Law Firm, PLLC

(57) ABSTRACT

Generally, the subject matter disclosed herein relates to methods for forming modern sophisticated semiconductor devices, and more specifically, methods wherein substantially lead-free solder bumps may be formed above a contact layer of a semiconductor chip. One illustrative method disclosed herein includes forming a solder bump above a metallization layer of a semiconductor device, removing an oxide film from a surface of the solder bump, and, after removing the oxide film, performing a solder bump reflow process in a reducing ambient to reflow the solder bump.

20 Claims, 5 Drawing Sheets

(51) Int. Cl.
*B23K 1/00* (2006.01)
*B23K 1/008* (2006.01)
*B23K 1/20* (2006.01)
*B23K 101/42* (2006.01)

(52) U.S. Cl.
CPC . *H01L 2224/119* (2013.01); *H01L 2224/1147* (2013.01); *H01L 2224/1181* (2013.01); *H01L 2224/11462* (2013.01); *H01L 2224/11849* (2013.01); *H01L 2224/13022* (2013.01); *H01L 2224/13082* (2013.01); *H01L 2224/13111* (2013.01); *H01L 2224/13147* (2013.01); *H01L 2224/13155* (2013.01); *H01L 2924/00014* (2013.01); *H01L 2924/01029* (2013.01); *H01L 2924/01322* (2013.01); *H01L 2924/01327* (2013.01)

(56) References Cited

U.S. PATENT DOCUMENTS

| | | | |
|---|---|---|---|
| 6,861,344 B2* | 3/2005 | Yajima | H01L 22/34 257/E21.508 |
| 7,319,341 B1* | 1/2008 | Harms et al. | 324/754.28 |
| 7,332,424 B2* | 2/2008 | Belanger et al. | 438/616 |
| 2003/0153172 A1 | 8/2003 | Yajima et al. | |
| 2006/0035454 A1* | 2/2006 | Belanger | H01L 24/11 438/616 |
| 2007/0023928 A1* | 2/2007 | Kuechenmeister | H01L 24/11 257/781 |
| 2008/0128476 A1* | 6/2008 | Wang | B23K 3/0623 228/256 |
| 2009/0302469 A1* | 12/2009 | Masuda et al. | 257/738 |
| 2010/0295177 A1* | 11/2010 | Ouchi | H01L 23/49811 257/737 |

FOREIGN PATENT DOCUMENTS

| | | |
|---|---|---|
| CN | 101512741 | 8/2009 |
| WO | 91/17897 | 11/1991 |
| WO | 2009/096216 | 8/2009 |

OTHER PUBLICATIONS

Jang et al., "UBM (Under Bump Metallization) Study for Pb-Free Electroplating Bumping : Interface Reaction and Electromigration," 2002 Electronic Components and Technology Conference.

Klein et al., "Development and Evaluation of Lead Free Reflow Soldering Techniques for the Flip Chip Bonding of Large GaAs Pixel Detectors on Si Readout Chip," 2008 Electronic Components and Technology Conference.

Zhang et al., "Lead-Free Bumping and Its Challenges".

Pages from internet "H:/Siegi/SROs/electrolytic plated wafer bump reflow.doc".

Office Action dated Jul. 11, 2014 from Sipo for Chinese application No. 201210241656.3.

\* cited by examiner

SOLDER BUMP CLEANING BEFORE REFLOW

BACKGROUND

1. Field of the Disclosure

Generally, the present disclosure relates to sophisticated integrated circuits, and, more particularly, to forming lead-free solder bumps on a contact layer of a semiconductor chip.

2. Description of the Related Art

In the manufacture of modern integrated circuits, it is usually necessary to provide electrical connections between the various semiconductor chips making up a microelectronic device. Depending on the type of chip and the overall device design requirements, these electrical connections may be accomplished in a variety of ways, such as, for example, by wirebonding, tape automated bonding (TAB), flip-chip bonding, and the like. In recent years, the use of flip-chip technology, wherein semiconductor chips are attached to substrates, carriers, or other chips by means of solder balls formed from so-called solder bumps, has become an important aspect of the semiconductor processing industry. In flip-chip technology, solders balls are formed on a contact layer of at least one of the chips that is to be connected, such as, for example, on a dielectric passivation layer formed above the last metallization layer of a semiconductor chip comprising a plurality of integrated circuits. Similarly, adequately sized and appropriately located bond pads are formed on another chip, such as, for example, a carrier package, each of which corresponds to a respective solder ball formed on the semiconductor chip. The two units, i.e., the semiconductor chip and carrier package, are then electrically connected by "flipping" the semiconductor chip and bringing the solder balls into physical contact with the bond pads, and performing a "reflow" process so that each solder ball bonds to a corresponding bond pad. Typically, hundreds, or even thousands, of solder bumps may be distributed over the entire chip area, thereby providing, for example, the I/O capability required for modern semiconductor chips that usually include complex circuitry, such as microprocessors, storage circuits, three-dimensional (3D) chips, and the like, and/or a plurality of integrated circuits forming a complete complex circuit system.

Historically, the materials used for forming solder balls used in flip-chip technology have included any one of a variety of so-called tin/lead (Sn/Pb) solders. In most commercially-used Sn/Pb solder alloys, the amount of tin (Sn) may vary from approximately 5% atomic weight up to approximately 70% atomic weight, with the balance of the solder alloy being lead (Pb). Furthermore, the melting temperatures of Sn/Pb solder alloys will vary according to the exact alloy make-up, a factor which has some influence on overall processing parameters. In the semiconductor processing industry, the most common Sn/Pb solders are 5/95 solders (i.e., 5% tin and 95% lead), 60/40 solders (i.e., 60% tin and 40% lead), and 63/37 solders (i.e., 63% tin and 37% lead, or so-called "eutectic" mixture). Eutectic Sn/Pb solder has an advantage of having the lowest melting temperature of the Sn/Pb solders (183° C.) which is truly a point, rather than a range, as may be exhibited by other non-eutectic Sn/Pb alloys.

In recent years, however, manufacturing industries have generally moved away from the use of Sn/Pb solders in most commercial applications, including semiconductor processing. Accordingly, lead-free soldering materials, such as Sn/Ag (tin-silver), Sn/Cu (tin-copper), Sn/Ag/Cu (tin-silver-copper, or SAC) solders, and the like, have been developed as substitute alloys for forming solder bumps. However, these substitute soldering materials generally may have a slightly higher melting temperature than most of the commonly-used Sn/Pb solders. Furthermore, at least some of these lead-free solder materials exhibit other process-related difficulties that must be addressed during semiconductor device manufacturing, as will be discussed in further detail below.

FIG. 1 is a process flow diagram that illustrates the various sequence of steps involved in forming lead-free solder bumps in accordance with one prior art solder bump process. In general, the illustrative prior art process sequence shown in FIG. 1 includes a first process step 110 wherein an underbump metallization (UBM) layer is formed, after which, in process step 120, a resist mask is formed in advance of performing a solder plating process in step 130. Thereafter, the resist mask is stripped in process step 140, the UBM layer is etched in process step 150, and finally, a solder bump reflow process is performed in process step 160. Each of the process steps identified in FIG. 1 and described in a general fashion above is illustrated in respective FIGS. 1*a*-1*f*, which will now be described in detail below.

FIG. 1*a* schematically illustrates the process step 110 of FIG. 1, wherein an underbump metallization (UBM) layer 104 is formed. The underbump metallization layer 104 may be formed on a patterned passivation layer 103, which may in turn be formed above a last metallization layer 101 of a semiconductor device 100. Depending on overall device architecture requirements, the semiconductor device 100 may comprise a plurality of integrated circuit elements, such as transistors, capacitors, resistors, conductive lines, contact elements, and the like. Additionally, the patterned passivation layer 103 may include an opening 103*a* that is positioned to expose a conductive contact pad 102 that is formed in the upper portion of the last metallization layer 101, which may provide electrical contact to one or more the plurality of integrated circuit elements of the semiconductor device 100.

As shown in FIG. 1*a*, the UBM layer 104 may be formed in a substantially conformal manner above the patterned passivation layer 103 so as to cover the exposed upper surface of the conductive contact pad 102, the sidewall surfaces of the opening 103*a*, and the upper surfaces of the passivation layer 103. Depending on overall process flow and device requirements, the UBM layer 104 may include a plurality of individual layers, each of which may be individually adapted to provide the requisite adhesion, barrier, protection, and conductivity characteristics of the overall UBM layer 104. For example, the UBM layer 104 may include, but not necessarily be limited to, a titanium-tungsten/chromium-copper/copper (TiW/CrCu/Cu) layer stack, a chromium/chromium-copper/copper (Cr/CrCu/Cu) layer stack, a titanium-tungsten/copper (TiW/Cu) layer stack, a titanium/copper/nickel (Ti/Cu/Ni) layer stack, a titanium-tungsten/nickel-vanadium/copper (TiW/NiV/Cu) layer stack, and the like, wherein the final copper layer may serve as a current distribution layer in a later-performed electroplating process (see process step 130 and FIG. 1*c*). The UBM layer 104 may be formed by an appropriately designed deposition sequence 111, which, may include a sputter deposition process, a chemical vapor deposition (CVD) process and the like, or a combination of these processes, depending on the material types and the number of layers used.

FIG. 1b schematically illustrates the semiconductor device 100 of FIG. 1a during a subsequent manufacturing step. More specifically, FIG. 1b shows process step 120 of FIG. 1, wherein a patterned resist mask 105 is formed above the UBM layer 104. Depending on the desired integration scheme, the patterned resist mask 105 may be formed by a process sequence 121 that includes a plurality of steps based on traditional photolithography techniques well known to those having skill in the art. As shown in FIG. 1b, the patterned resist mask 105 may include an opening 105a formed above the opening 103a in the patterned passivation layer 103, thereby defining the position and initial shape of the solder bump 106 in the as-plated condition, as will be described more fully below.

As schematically illustrated in FIG. 1c, further processing of the semiconductor device 100 of FIG. 1b is continued during process step 130, wherein a lead-free solder bump 106 is formed in the openings 103a and 105a of the patterned passivation layer 103 and resist mask 105, respectively. As previously noted, the underbump metallization layer 104 may act as a current distribution layer during an electrochemical deposition process 131, such as an electroplating process, thereby facilitating the electrochemical deposition of the solder material used to form the solder bump 106. The solder bump material may be any one of several lead-free solder materials known in the art, such as Sn/Ag, Sn/Cu, Sn/Ag/Cu (SAC), and the like. Furthermore, depending on the device requirements and/or the desired processing scheme, the solder bump 106 may be formed on an underlying pillar comprising electrochemically deposited copper (Cu) or nickel (Ni), and the like. For example, in at least one embodiment, the solder bump 106 may be formed on a nickel pillar, and may be made up of a tin/silver (Sn/Ag) alloy solder material having a silver content in the range of approximately 1.8% to 3.0% by weight, whereas the balance of the solder alloy may be substantially tin. Depending on various processing considerations, such as reflow temperatures and the like, other weight percentages of silver and/or copper, in combination with tin, may also be used.

FIG. 1d schematically illustrates the semiconductor device 100 of FIG. 1c during the process step 140 shown in FIG. 1, wherein the patterned resist mask 105 is removed from above the UBM layer 104. As shown in FIG. 1d, a resist strip process 141 may be performed so as to selectively remove the patterned resist mask 105 relative the materials of the underbump metallization layer 104 and the as-plated solder bump 106. Depending on the desired processing strategy, the resist strip process 141 may be, for example, a wet chemical strip process or a dry etch process, recipes for which are well known in the art. During process step 150, the UBM layer 104 may be patterned so as to electrically isolate the solder bump 106 from other adjacent solder bumps that may have been simultaneously formed during the process sequence described by process steps 110-140. As shown in FIG. 1e, the UBM layer 104 may be patterned by performing an etch sequence 151, which, depending on the number and material variety of any sub-layers that may make up the UBM layer 104, may include a plurality of wet and/or dry etch techniques.

Thereafter, the substrate comprising the semiconductor device 100 may be transported to a furnace tool (not shown) where the bump reflow process step 160 will subsequently be performed. However, prior to loading the substrate comprising semiconductor device 100 into the furnace tool (not shown), the device 100 may be exposed to ambient atmospheric conditions, during which time a native tin oxide layer 107 may be formed on the exposed surface of the newly formed solder bump 106, as shown in FIG. 1e.

During the bump reflow process step 160, the semiconductor device 100 of FIG. 1e may be exposed to a reflow process 161, which, as shown in FIG. 1f, transforms the solder bump 106 of FIG. 1e into a substantially rounded solder ball 108. The reflow process 161 may be performed in a programmable oven or furnace having, for example, resistive heaters or infrared (IR) lamps, and, depending on the composition of the solder material comprising the solder bump 106, may be performed at reflow temperatures in the range of approximately 200-300° C. For example, for Sn/Ag solder bumps having a silver content in the range of 1.8-3.0 weight percent, the reflow process 161 may be performed between approximately 225° C. and 250° C. Additionally, the reflow process 161 may be performed for a duration as may be appropriate for the specific solder material composition so as to improve the overall uniformity of the solder alloy material, and, furthermore, to diffuse solder bump material into the UBM layer 104, thereby forming intermetallic compounds that may provide the rounded solder ball 108 with high mechanical toughness.

As noted above, a native tin oxide layer 107 may have formed on the exposed surface of the solder bump 106 between process steps 150 and 160. This native tin oxide layer 107 is typically removed during the reflow process 161 so that an oxide layer will not be present on the surface of the reflown solder ball 108. Accordingly, the reflow process 161 may be performed in a substantially reducing ambient that is adapted to remove any native tin oxide layer 107 that may be present on the exposed surface of the solder bump 106. In certain embodiments, the reducing ambient may comprise gaseous formic acid ($CH_2O_2$), which removes the native tin oxide layer 107 during the reflow process 161 by chemically reacting with the tin oxide (SnO) on the surface of the solder bumps 106 to form tin byproducts, such as $Sn(CHO_2)_2$ (tin II formate) and the like.

It should be further noted, however, that during normal substrate processing, a significant wait time may occur between process step 150 (UBM etch) and process step 160 (bump reflow), which may sometimes be on the order of several hours, or even up to a day or more. While such extended wait times, and the commensurate lengthy exposure of solder bumps to ambient conditions, were not normally detrimental to tin-lead (Sn/Pb) solder bumps, the surface oxidation rate of solder alloys having a very high weight percentage tin concentration (such as Sn/Ag solders) may be significantly higher than that of the typical Sn/Pb solders. As such, the amount of tin oxide that must be removed from the surface of solder bumps 106 made of Sn/Ag alloy solders is proportionately greater. Moreover, any tin byproducts that are formed during the reflow process 161 may have a tendency to deposit preferentially on the inside surfaces of the furnace tool and exhaust lines and, over time, may flake off of these surfaces and re-deposit as particle defects 109 on the exposed surfaces of the device 100, including the reflown solder ball 108, as shown in FIG. 1f. These particle defects 109 may also interfere with the electrical connection that is obtained between the solder balls 108 on a semiconductor chip and the bond pads on a package carrier, thereby potentially reducing device reliability. To avoid the occurrence of such particle defects 109, the furnace tool where the reflow process 161 is performed must be periodically cleaned on a regular basis.

On the one hand, device reliability may be increased by increasing the tool cleaning frequency—i.e., shortening the tool cleaning cycle—however, at the expense of tool downtime and the corresponding decrease in overall productivity. On the other hand, productivity may be increased by reducing the tool cleaning frequency—i.e., lengthening the tool cleaning cycle—however, at the expense of increased particle defects and a corresponding decrease in overall device reliability. Accordingly, and in view of the foregoing, there is a need to implement new design strategies to address the manufacturing issues associated with forming lead-free solder bumps on semiconductor chips. The present disclosure relates to process schemes that are directed to avoiding, or at least mitigating, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to methods for forming modern sophisticated semiconductor devices, and more specifically, methods wherein substantially lead-free solder bumps may be formed above a contact layer of a semiconductor chip. One illustrative method disclosed herein includes forming a solder bump above a metallization layer of a semiconductor device, removing an oxide film from a surface of the solder bump, and, after removing the oxide film, performing a solder bump reflow process in a reducing ambient to reflow the solder bump.

In another illustrative embodiment of the present disclosure, a method includes forming a solder bump above a last metallization layer formed above a semiconductor device, and exposing said solder bump to an oxygen-containing environment. The disclosed method further includes, among other things, exposing the solder bump to a wet chemical cleaning process to substantially remove the native oxide film from the surface of the solder bump, and, after exposing the solder bump to the wet chemical cleaning process, reflowing the solder bump in a reflow ambient comprising formic acid.

Also disclosed herein is a method that includes, among other things, forming a substantially lead-free solder bump above an underbump metallization layer of a semiconductor device, performing a wet chemical cleaning process to remove an oxide film from a surface of the solder bump by exposing the solder bump to an acid solution comprising one of formic acid and hydrochloric acid, and performing a reflow process to reflow the solder bump in an ambient comprising formic acid.

BRIEF DESCRIPTION OF THE DRAWINGS

The disclosure may be understood by reference to the following description taken in conjunction with the accompanying drawings, in which like reference numerals identify like elements, and in which.

Figure 1:
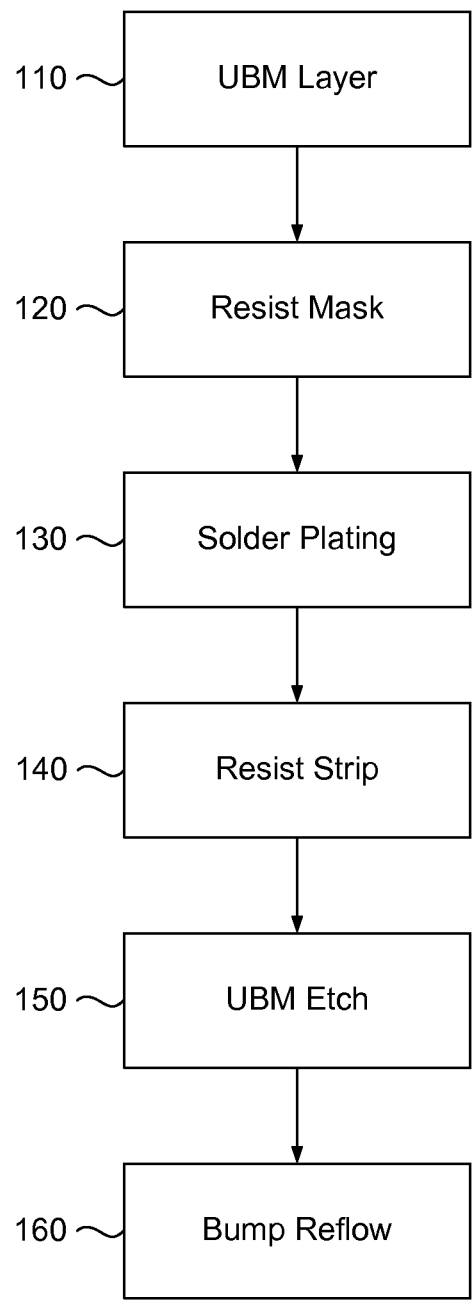
FIG. 1 is a process flow diagram that illustrates a sequence of steps involved in forming lead-free solder bumps in accordance with one prior art solder bump process.
Figure 1A:
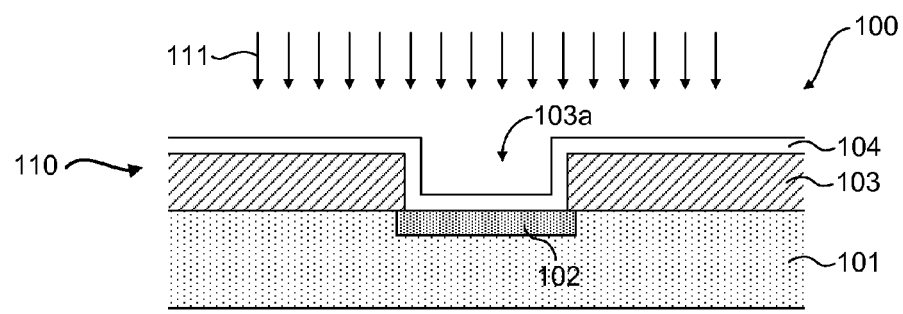
FIGS. 1*a*-1*f* schematically illustrate the process step outlined in FIG. 1.
Figure 1B:
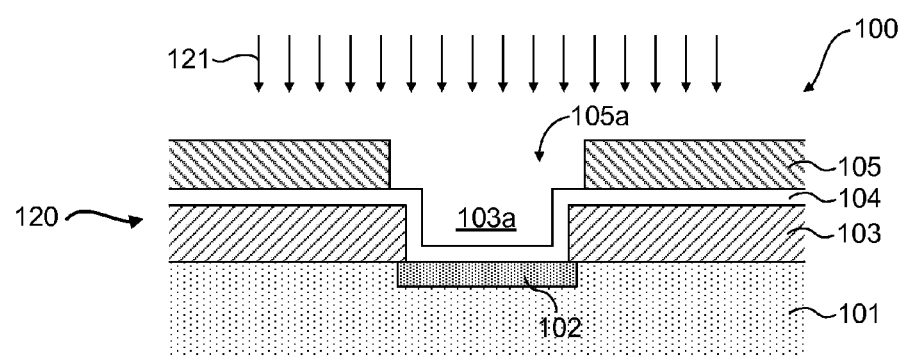
Figure 1C:
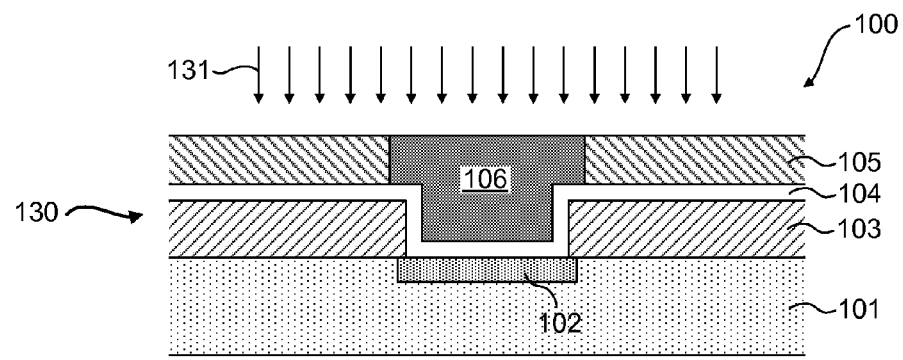
Figure 1D:
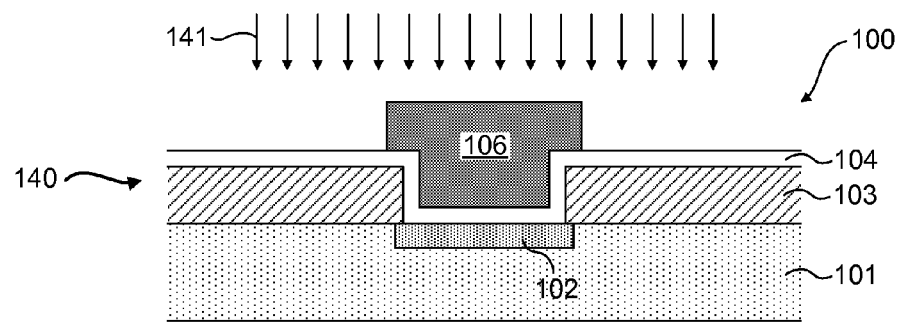

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the presently disclosed subject matter provides manufacturing techniques for forming lead-free solder bumps, such as Sn/Ag solder bumps and the like, having a reduced likelihood of containing particle defects due to tin byproducts after a solder bump reflow process has been performed. For example, an intermediate cleaning step may be performed prior to performing a solder bump reflow process so as to substantially remove any native oxides that may form on the surfaces of newly-formed solder bumps during the exposure of the solder bumps to ambient atmospheric conditions. In some embodiments, the intermediate cleaning step may be, for example, a wet cleaning process that is adapted to remove substantially all native oxides, and which may be performed immediately before the reflow process is performed. The intermediate cleaning process reduces the overall processing concerns associated with the extended wait times that may occur after the underbump metallization layer has been etched and patterned and before the solder bump reflow process is performed. Furthermore, the reduced presence of a native oxide layer on the surfaces of the solder bumps during the reflow process contributes to a higher tolerance to the possibility that free oxygen may inadvertently be present in the reducing ambient when the reflow process is performed. Moreover, since less native oxide needs to be removed from the solder bumps during any given reflow process cycle, longer cleaning cycles may be also realized for the reflow process furnace tool, as a lesser amount of reacted material, in the form of tin byproducts and the like, may deposit on the inside surfaces of the furnace tool during a given reflow cycle.

It should be noted that, where appropriate, the reference numbers used in describing the various elements shown in the illustrative embodiments of FIG. 2 and FIGS. 2a-2c substantially correspond to the reference numbers used in describing the corresponding elements illustrated in FIG. 1 and FIGS. 1a-1f above, except that the leading numeral has been changed from a "1" to a "2," as may be appropriate. For example, process step "130" corresponds to process step "230," semiconductor device "100" corresponds to semiconductor device "200," the last metallization layer "101" corresponds to last metallization layer "201," the solder bump "106" corresponds to the solder bump "206," and so on. Accordingly, the reference number designations used to identify some elements of the presently disclosed subject matter may be illustrated in FIG. 2 and FIGS. 2a-2c, but may not be specifically described in the following disclosure. In those instances, it should be understood that the numbered elements shown in FIGS. 2a-2c which are not described in detail below substantially correspond with their like-numbered counterparts illustrated in FIG. 1, and described in the associated disclosure set forth above.

Furthermore, it should also be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 100 depicted in FIG. 1c, it should be understood that the patterned passivation layer 103 is formed "above" the last metallization layer 101, and the conductive contact pad 102 is positioned "below" or "under" the underbump metallization (UBM) layer 104. Similarly, it should also be noted that the solder bump 106 may be positioned "on" the UBM layer 104 in those embodiments wherein no other layers or structures are interposed therebetween.

Figure 2:
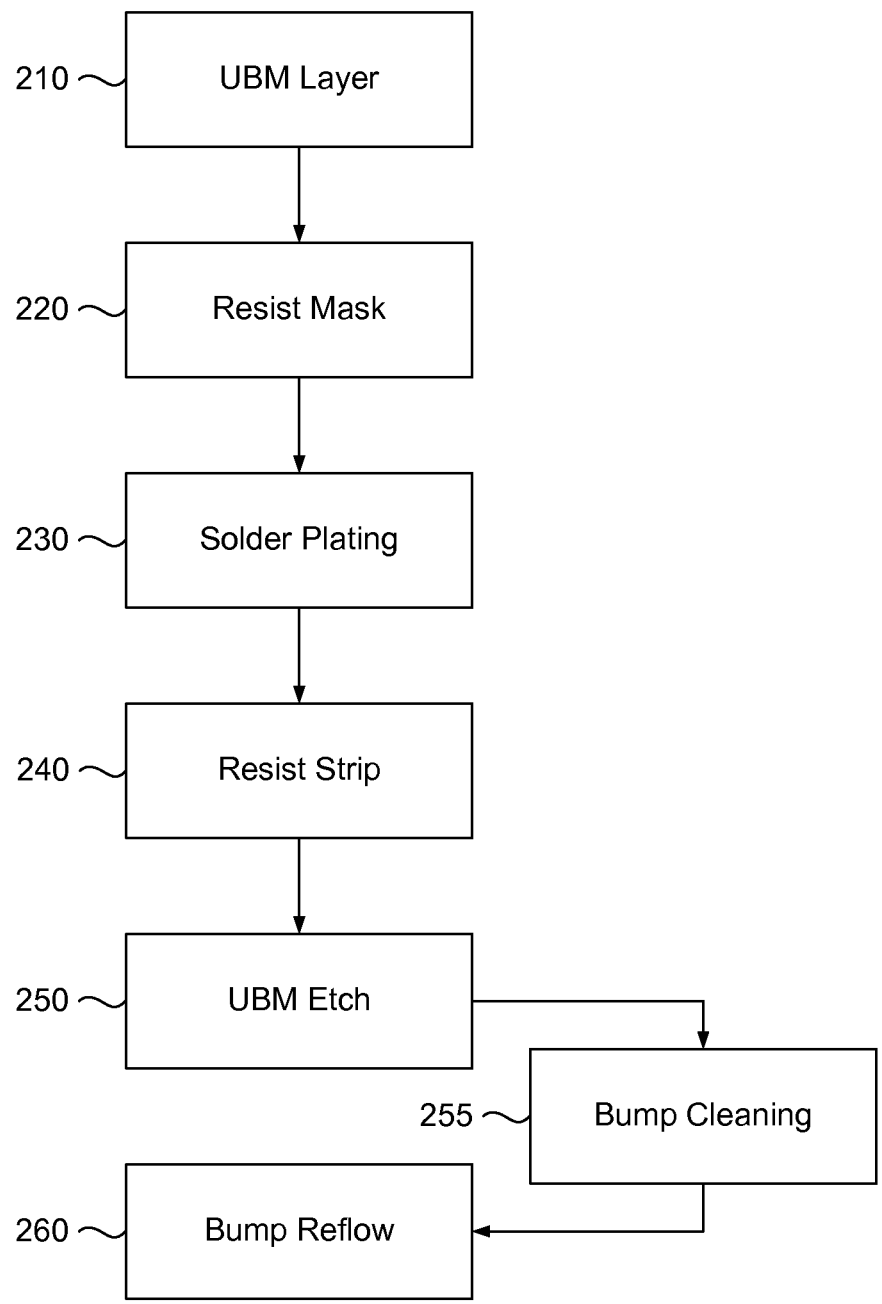
FIG. 2 is a process flow diagram that illustrates a sequence of steps involved in forming lead-free solder bumps in accordance one illustrative embodiment of the subject matter disclosed herein.

FIG. 2 is a process flow diagram that illustrates a sequence of steps involved in forming lead-free solder bumps in accordance with one illustrative embodiment of the presently disclosed subject matter. In general, the illustrative process sequence shown in FIG. 2 includes a first process step 210 wherein an underbump metallization (UBM) layer is formed, after which, a resist mask is formed in process step 220, followed by a solder plating process in step 230. Thereafter, the resist mask is stripped in process step 240, and the UBM layer is etched in process step 250. However, as will be noted when the process sequence of FIG. 2 is compared to the prior art process flow sequence shown in FIG. 1, the sequence depicted in FIG. 2 includes an additional bump cleaning process step 255, which is performed so as to remove the native oxide that may form on the solder bumps between the UBM etch process step 250 and the bump reflow process step 260. After the bump cleaning process step 255, the solder bumps are reflowed in process step 260. The process steps 250, 255 and 260 shown in FIG. 2 are illustrated in respective FIGS. 2a-2c, and will hereinafter be described in detail below.

Figure 1E:
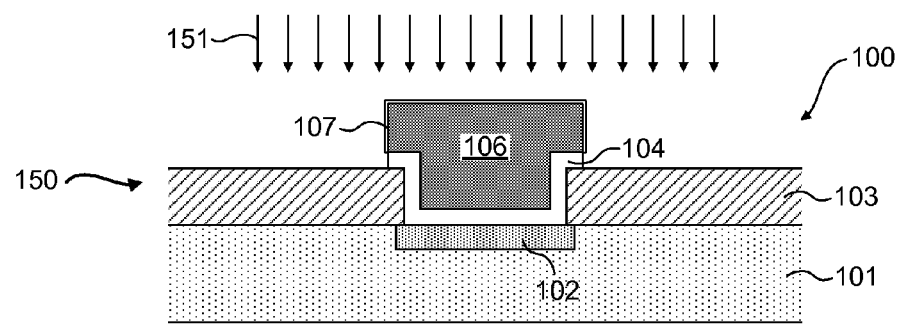
Figure 1F:
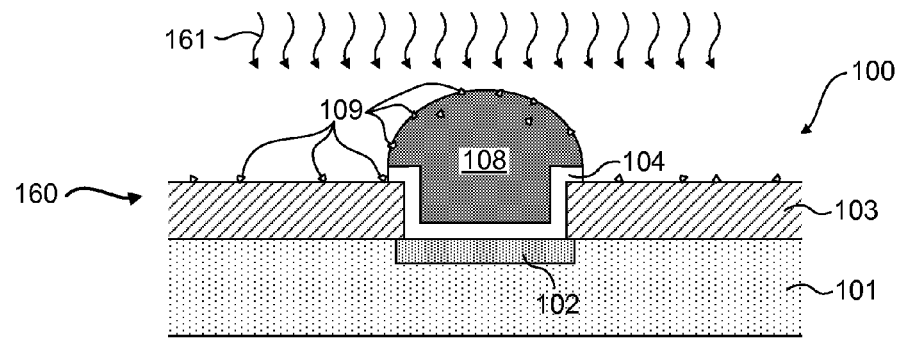
Figure 2A:
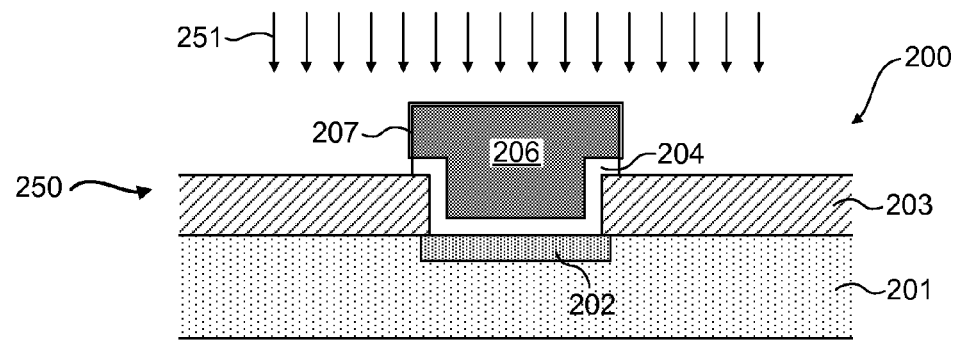
FIGS. 2*a*-2*c* schematically illustrate some of the process steps outlined in FIG. 2.

Process step 250 as illustrated in FIG. 2a substantially corresponds to process step 150 illustrated in FIG. 1e and described above. More specifically, during process step 250, the UBM layer 204 may be patterned so as to electrically isolate the solder bump 206 from other adjacent solder bumps that may have been simultaneously formed during the process sequence of process steps 210-240. As shown in FIG. 2a, the UBM layer 204 may be patterned by performing an etch sequence 251 well known to those having ordinary skill in the art. Thereafter, the substrate comprising the semiconductor device 200 may be transported to a furnace tool (not shown) where the bump reflow process step 260 will subsequently be performed. In some illustrative embodiments, a significant wait time may occur between the time the UBM layer 204 is etched in process step 250 and the bump reflow process step 260 is performed, during which time the solder bump 206 may be exposed to ambient atmospheric conditions, and a native tin oxide layer 207 may be formed on the exposed surface of the newly formed solder bump 206, as shown in FIG. 2a.

Figure 2B:
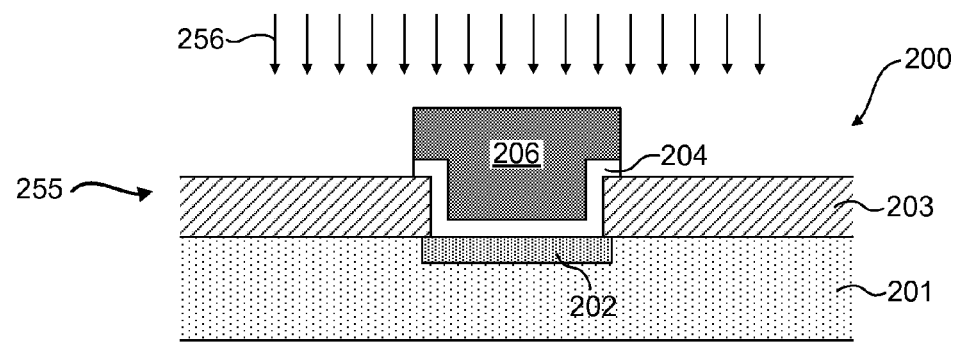

As schematically illustrated in FIG. 2b, in certain illustrative embodiments, a bump cleaning process step 255 may be performed prior to performing the bump reflow process step 260. For example, the solder bump 206 may be exposed to a wet cleaning process 256 adapted to remove the native tin oxide layer 207 for a time ranging from 15-330 seconds, using a suitable acid solution having a molar concentration in the range of approximately 0.05M to 4.0M. In some embodiments, the acid employed for the wet cleaning process 256 may include, for example, methanesulfonic acid (or mesylic acid; $CH_3SO_3H$), formic acid ($CH_2O_2$), nitric acid ($HNO_3$), or hydrochloric acid (HCl). In at least some illustrative embodiments, the wet cleaning process 256 may be performed using formic acid or hydrochloric acid having a molar concentration in the range of 0.3M to 0.5M, for a duration on the order of 20-120 seconds.

Figure 2C:
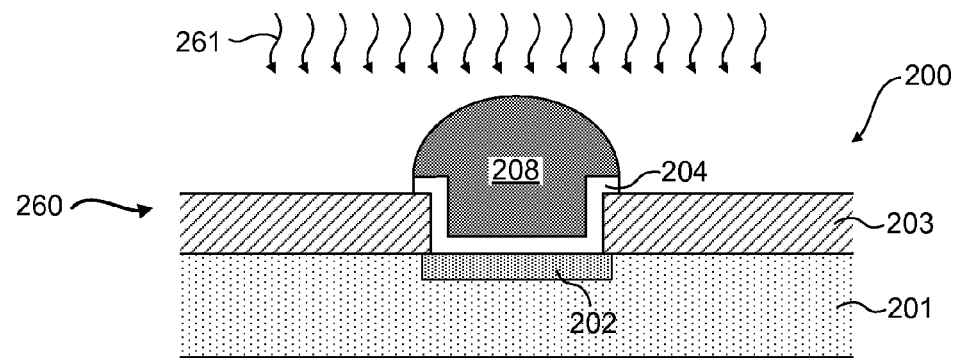

In some embodiments of the present disclosure, a bump reflow process step 260 may thereafter be performed, wherein the cleaned solder bump 206 of the semiconductor device 200 depicted in FIG. 2b may be exposed to a reflow process 261. As shown in FIG. 2c, the reflow process 261 transforms the solder bump 206 of FIG. 2b into a substantially rounded solder ball 208, and may be performed substantially as described above with respect to process step 160 and FIG. 1f.

As noted previously, lead-free solder alloy materials comprising a relatively high weight percentage of tin, such as, for example, Sn/Ag solder alloys and the like, have a higher affinity for oxygen, and therefore a relatively high surface oxidation rate. Accordingly, in certain illustrative embodiments, the cleaned solder bump 206 may be subjected to the solder bump reflow process step 260 within approximately 12 hours after the completion of the bump cleaning process step 250 so as to limit the amount of native tin oxide that may form on the surface of the cleaned solder bump 206. This in turn may reduce the likelihood that particle defects, such as the particle defects 109 shown in FIG. 1f, may re-deposit on the surface of the reflown solder ball 208, and likewise increase the time between the cleaning cycles of the furnace tool where the reflow process 261 is performed.

As a result, the subject matter disclosed herein provides manufacturing techniques for forming lead-free solder bumps on the contact layer of a semiconductor chip having a reduced likelihood of particle defects. Additionally, the disclosed methods enable a longer tool run between cleaning cycles, thereby increasing overall device productivity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a solder bump above a metallization layer of a semiconductor device, wherein forming said solder bump comprises embedding a portion of said solder bump in a passivation layer that is formed above said metallization layer;
    after forming said solder bump, removing an oxide film from a surface of said solder bump by performing a wet chemical cleaning process; and
    after removing said oxide film, performing a solder bump reflow process in a reducing ambient to reflow said solder bump into a solder ball.

2. The method of claim 1, wherein performing said solder bump reflow process in said reducing ambient comprises performing said solder bump reflow process in an ambient comprising formic acid.

3. The method of claim 1, further comprising exposing said surface of said solder bump to an oxidizing ambient prior to removing said oxide film.

4. The method of claim 1, wherein performing said wet chemical cleaning process comprises exposing said surface of said solder bump to an acid solution comprising one of methanesulfonic acid, formic acid, nitric acid and hydrochloric acid.

5. The method of claim 1, wherein performing said wet chemical cleaning process comprises using an acid solution having a molar concentration in the range of approximately 0.05M to 4.0M.

6. The method of claim 1, wherein performing said wet chemical cleaning process comprises exposing said surface of said solder bump to said acid solution for a time ranging from approximately 15 seconds to approximately 330 seconds.

7. The method of claim 1, wherein performing said wet chemical cleaning process comprises exposing said surface of said solder bump to an acid solution comprising one of formic acid and hydrochloric acid, said acid solution having a molar concentration in the range of approximately 0.3M to 0.5M.

8. The method of claim 7, wherein performing said wet chemical cleaning process comprises exposing said surface of said solder bump to said acid solution for a time ranging from approximately 20 second to approximately 120 seconds.

9. A method, comprising:
    forming a solder bump above a last metallization layer formed above a semiconductor device, wherein forming said solder bump comprises embedding a portion of said solder bump in a passivation layer that is formed above said last metallization layer;
    after forming said solder bump, exposing said solder bump to an oxygen-containing environment;
    after exposing said solder bump to said oxygen-containing environment, exposing said solder bump to a wet chemical cleaning process to substantially remove a native oxide film from said surface of said solder bump; and
    after exposing said solder bump to said wet chemical cleaning process, reflowing said solder bump in a reflow ambient comprising formic acid so as to transform said solder bump into a solder ball.

10. The method of claim 9, wherein said native oxide film forms on said surface of said solder bump during said exposure to said oxygen-containing environment.

11. The method of claim 9, wherein exposing said solder bump to a wet chemical cleaning process comprises exposing said solder bump to an acid solution comprising one of formic acid and hydrochloric acid, said acid solution having a molar concentration in the range of approximately 0.3M to 0.5M.

12. The method of claim 11, wherein exposing said solder bump to said wet chemical cleaning process comprises exposing said surface of said solder bump to said acid solution for a time ranging from approximately 20 second to approximately 120 seconds.

13. The method of claim 9, wherein forming said solder bump comprises forming said solder bump from a substantially lead-free material comprising at least one of tin, silver and copper.

14. The method of claim 13, wherein forming said solder bump from a substantially lead-free material comprises forming said solder bump from an alloy comprising tin and approximately 1.8 to 3.0 weight percent silver.

15. A method, comprising:
    forming a substantially lead-free solder bump above an underbump metallization layer of a semiconductor device;
    after forming said solder bump, performing a wet chemical cleaning process to remove an oxide film from a surface of said solder bump by exposing said solder bump to an acid solution comprising one of formic acid and hydrochloric acid, wherein said wet chemical cleaning process is performed prior to performing any reflow processes on said solder bump; and
    after performing said wet chemical cleaning process, performing a reflow process to reflow said solder bump into a solder ball, wherein said reflow process is performed in an ambient comprising formic acid.

16. The method of claim 15, wherein said oxide film forms on said surface of said solder bump when said solder bump is exposed to an ambient comprising oxygen.

17. The method of claim 15, wherein said reflow process is performed within approximately 12 hours after performing said wet chemical cleaning process.

18. The method of claim 1, wherein said reflow process is performed prior to performing a flip-chip operation to bond a semiconductor chip comprising said semiconductor device to a carrier substrate.

19. The method of claim 9, wherein reflowing said solder bump is performed prior to performing a flip-chip operation to bond a semiconductor chip comprising said semiconductor device to a carrier substrate.

20. A method, comprising:
    forming a solder bump above a last metallization layer formed above a semiconductor device;

exposing said solder bump to an oxygen-containing environment, wherein a native oxide film is formed on said solder bump during said exposure of said solder bump to said oxygen-containing environment;

exposing said solder bump to a wet chemical cleaning process to substantially remove said native oxide film from said surface of said solder bump, wherein said solder bump is exposed to said wet chemical cleaning process prior to performing any reflow processes on said solder bump;

after exposing said solder bump to said wet chemical cleaning process and prior to performing any reflow processes on said solder bump, forming an additional native oxide film on said surface of said solder bump;

after forming said additional native oxide film, reflowing said solder bump in a reflow ambient comprising formic acid so as to transform said solder bump into a solder ball; and removing said additional native oxide film from said surface of said solder bump while reflowing said solder bump.

\* \* \* \* \*